United States Patent
Chung

(10) Patent No.: US 9,116,825 B2
(45) Date of Patent: Aug. 25, 2015

(54) MEMORY CONTROLLER

(71) Applicant: VIA Technologies, Inc., New Taipei (TW)

(72) Inventor: Ming-Han Chung, New Taipei (TW)

(73) Assignee: VIA Technologies, Inc., New Taipei (CN)

( * ) Notice: Subject to any disclaimer, the term of this patent is extended or adjusted under 35 U.S.C. 154(b) by 236 days.

(21) Appl. No.: 13/910,138

(22) Filed: Jun. 5, 2013

(65) Prior Publication Data

US 2013/0332797 A1    Dec. 12, 2013

Related U.S. Application Data

(60) Provisional application No. 61/656,554, filed on Jun. 7, 2012.

(51) Int. Cl.
*H03M 13/00* (2006.01)
*G06F 11/10* (2006.01)
*H03M 13/11* (2006.01)

(52) U.S. Cl.
CPC ............. *G06F 11/10* (2013.01); *H03M 13/116* (2013.01); *H03M 13/1117* (2013.01); *H03M 13/616* (2013.01); *H03M 13/6502* (2013.01)

(58) Field of Classification Search
CPC . G06F 11/10; G06F 11/1044; G06F 11/1048; H03M 13/116; H03M 13/616; H03M 13/6502

USPC ................... 714/746, 763, 781, 800
See application file for complete search history.

(56) References Cited

U.S. PATENT DOCUMENTS

| | | | |
|---|---|---|---|
| 7,773,032 B2 | 8/2010 | Feria | |
| 8,015,438 B2* | 9/2011 | Bruennert et al. | 714/6.13 |
| 2010/0241932 A1* | 9/2010 | Sakaue et al. | 714/784 |

OTHER PUBLICATIONS

"Office Action of Taiwan Counterpart Application", issued on May 11, 2015, p. 1-2.

* cited by examiner

*Primary Examiner* — Shelly A Chase
(74) *Attorney, Agent, or Firm* — Jianq Chyun IP Office

(57) ABSTRACT

A memory controller is provided. The memory controller includes a memory interface and an encoding module. The memory interface is configured to couple to a memory chip. The encoding module is coupled to the memory interface and includes a shared memory and a parity generation module. The parity generation module is coupled to the shared memory. The parity generation module reads at least one basic vector from the shared memory, determines a dimension of the at least one basic vector, generates a generation matrix according to the at least one basic vector, converts a raw data into a codeword through the generation matrix, and stores the codeword into the memory chip through the memory interface.

16 Claims, 3 Drawing Sheets

MEMORY CONTROLLER

CROSS-REFERENCE TO RELATED APPLICATION

This application claims the priority benefits of U.S. provisional application Ser. No. 61/656,554, filed on Jun. 7, 2012. The entirety of the above-mentioned patent application is hereby incorporated by reference herein and made a part of this specification.

BACKGROUND OF THE INVENTION

1. Field of the Invention

The present invention generally relates to an electronic circuit, and more particularly, to a memory controller.

2. Description of Related Art

Along with the development of data access technologies, error-correcting codes have become increasingly important to the integrity and correctness of accessed data. The technique of encoding/decoding data and providing error-correcting codes by using low density parity check (LDPC) codes has been broadly used in the communication field.

However, when the LDPC encoding/decoding technique is applied to accessing data in a memory, it is not easy to achieve high data access efficiency and small hardware volume at the same time.

SUMMARY OF THE INVENTION

Accordingly, the present invention is directed to a memory controller, in which the circuit area of a memory is reduced and the encoding/decoding efficiency is improved.

The present invention provides a memory controller. The memory controller includes a memory interface and an encoding module. The memory interface is configured to couple to a memory chip. The encoding module is coupled to the memory interface. The encoding module includes a shared memory and a parity generation module. The parity generation module is coupled to the shared memory. The parity generation module reads at least one basic vector from the shared memory and determines a dimension of the at least one basic vector. The parity generation module generates a generation matrix according to the at least one basic vector with the determined dimension, converts a raw data into a codeword through the generation matrix, and stores the codeword into the memory chip through the memory interface.

The present invention provides a memory controller. The memory controller includes a memory interface and a decoding module. The memory interface is configured to couple to a memory chip. The decoding module is coupled to the memory interface. The decoding module includes an internal memory, a bit node processor, and a check module. The internal memory stores a decision ratio matrix corresponding to a codeword from the memory interface. The bit node processor is coupled to the internal memory. The bit node processor reads the decision ratio matrix from the internal memory. The check module is coupled to the internal memory and the bit node processor. The check module performs an iterative calculation on the decision ratio matrix from the bit node processor through a check matrix to update the decision ratio matrix stored in the internal memory and generates a modification matrix according to the result of the iterative calculation. The bit node processor modifies the updated decision ratio matrix read from the internal memory according to the modification matrix, and the check module determines whether to perform the iterative calculation repeatedly according to the modified decision ratio matrix. If the check module determines not to perform the iterative calculation repeatedly, the check module generates a decoded data according to the modified decision ratio matrix.

As described above, in a memory controller provided by an embodiment of the present invention, an encoding module adaptively adjusts the dimension of a generation matrix, and a single memory is used to reduce the number of memories. Additionally, in a memory controller provided by an embodiment of the present invention, every time after an iterative calculation is performed, a decoding module determines whether to perform another iterative calculation. Thus, even though a predetermined number of iterations is not reached, the iterative calculation is terminated as long as the result of the iterative calculation satisfies the requirement of the application, so that the decoding efficiency is improved.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
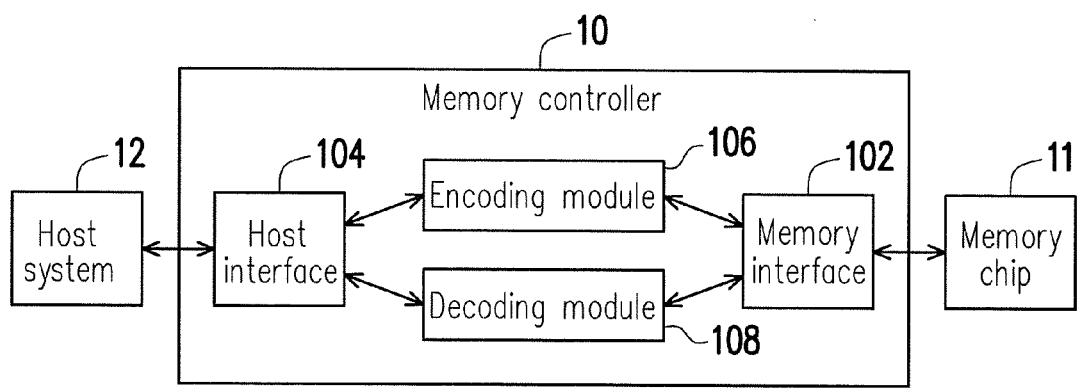
FIG. 1 is a diagram of a memory controller according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a memory controller according to an embodiment of the present invention. Referring to FIG. 1, the memory controller 10 includes a memory interface 102, a host interface 104, an encoding module 106, and a decoding module 108. The memory interface 102 is configured to couple to a memory chip 11, and the host interface 104 is configured to couple to a host system 12. The memory chip 11 can be any type of non-volatile memory (NVM), such as a flash memory or any other type of memory or storage medium. In other embodiments, the memory chip 11 can be any type of volatile memory. The output terminal of the encoding module 106 is coupled to the memory interface 102, and the input terminal of the encoding module 106 is coupled to the host interface 104. The encoding module 106 is configured to perform an encoding function. The input terminal of the decoding module 108 is coupled to the memory interface 102, and the output terminal of the decoding module 108 is coupled to the host interface 104. The decoding module 108 is configured to perform a decoding function.

For example, when the host system 12 demands to write a raw data into the memory chip 11, the raw data is first transmitted to the host interface 104 by the host system 12, and then the raw data is transmitted to the encoding module 106 through the host interface 104. Then, a codeword is generated by the encoding module 106 encodes according to the raw data from the host interface 104. The codeword includes the raw data and error correction information related to the raw data. The codeword is written into the memory chip 11 by the memory controller 10 through the memory interface 102. In addition, when the host system 12 demands to read a specific data from the memory chip 11, the host system 12 may issue a read command to the memory controller 10 through the host interface 104. Then, the memory controller 10 reads a corresponding codeword from the memory chip 11 through the memory interface 102 according to the read command, decodes the codeword through the decoding module 108, and transmits the decoded specific data to the host system 12 through the host interface 104.

In the present embodiment, one or both of the encoding module 106 and the decoding module 108 are disposed in the memory controller 10. For example, when the memory controller 10 requires only the encoding function, only the encoding module 106 is disposed in the memory controller 10 while the decoding module 108 is removed. In another embodiment, when the memory controller 10 requires only the decoding function, only the decoding module 108 is disposed in the memory controller 10 while the encoding module 106 is removed. When the memory controller 10 requires both the encoding and decoding functions, the encoding module 106 and the decoding module 108 are both disposed in the memory controller 10.

In the present embodiment, the encoding/decoding functions provided by the encoding module 106 and the decoding module 108 may be carried out by low density parity check (LDPC) codes or other different coding formats. For example, the encoding module 106 can perform an operation expressed as following equation (1) on a raw data to be stored to generate an encoded codeword.

$$v=cG \qquad \text{equation (1)}$$

In foregoing equation (1), c represents the raw data from the host interface 104, G represents a generation matrix, and v represents the encoded codeword. Particularly, according to the calculational rule of the equation (1), the number of rows of the generation matrix G is equal to the number of columns of the raw data c (i.e., the bit number of the raw data c). For example, assuming that each time the encoding module 106 can process (i.e., encode) the raw data c provided with K bits, the raw data c can be expressed as a 1×K matrix. The generation matrix G can be expressed as a K×L matrix, where K and L are both positive integers. Because the number of columns of the generation matrix G is L (i.e., the codeword v generated by the encoding module 106 has L bits), the codeword v can be expressed as a 1×L matrix. For example, if the raw data c has 3 bits (i.e., a 1×3 matrix) and the generation matrix G is a 3×6 matrix, the encoding module 106 can obtain a 6-bit codeword v (i.e., a 1×6 matrix) through foregoing equation (1). That is, the codeword v containing the raw data c and an error correction code (ECC) can be generated through the generation matrix G of equation (1). The ECC could be used for verifying the correctness or integrity of the raw data c. Additionally, all elements or bits in the raw data c, the generation matrix G, and the codeword v are expressed in binary (i.e., 0 or 1). In an embodiment, the multiplication of elements in foregoing equation (1) can be implemented by using AND gates, and the addition of elements can be implemented by using exclusive OR gates or XOR gates.

In the present embodiment, the generation matrix G is a systematic-circulant matrix. Namely, the generation matrix G can be generally expressed as following equation (2).

$$G=[I|P] \qquad \text{equation (2)}$$

In foregoing equation (2), I is an identity matrix, and P is a parity matrix.

For example, assuming that the raw data c=[1 1 0], and the generation matrix $$G = \begin{bmatrix} 1 & 0 & 0 & 1 & 1 & 0 \\ 0 & 1 & 0 & 0 & 1 & 1 \\ 0 & 0 & 1 & 1 & 0 & 1 \end{bmatrix},$$

the codeword generated by the encoding module 106 is v=[1 1 0 1 0 1], where the first 3 bits (i.e., [1 1 0]) of the codeword v are the same as the raw data c, and the last 3 bits (i.e., [1 0 1]) are the ECC corresponding to the raw data c. As mentioned above, the ECC can be used for verifying the raw data c. Besides, as shown in the equation (2), the generation matrix G comprises the identity matrix I and the parity matrix P. In the present embodiment, the identity matrix I is $$\begin{bmatrix} 1 & 0 & 0 \\ 0 & 1 & 0 \\ 0 & 0 & 1 \end{bmatrix},$$

and the parity matrix P is $$\begin{bmatrix} 1 & 1 & 0 \\ 0 & 1 & 1 \\ 1 & 0 & 1 \end{bmatrix}.$$

The parity matrix P comprises three 1×3 column matrices, and the three 1×3 column matrices are respectively [1 1 0], [0 1 1], and [1 0 1]. As mentioned above, the generation matrix G is a systematic-circulant matrix. Thus, the first 1×3 column matrix (i.e., [1 1 0]) is circularly shifted for one matrix element to the right to obtain the second 1×3 column matrix (i.e., [0 1 1]). Similarly, he second 1×3 column matrix is circularly shifted for one matrix element to the right to obtain the third 1×3 column matrix (i.e., [1 0 1]), and the third 1×3 column matrix is circularly shifted for one matrix element to the right to obtain the first 1×3 column matrix. Based on this characteristic, when the parity matrix P is demanded to be stored, only one column matrix (herein this column matrix is referred to as a basic vector) thereof is stored to reduce the storage space. Other column matrices of the parity matrix P can be obtained by circularly shifting the stored basic vector for one or more element to the right.

Figure 2:
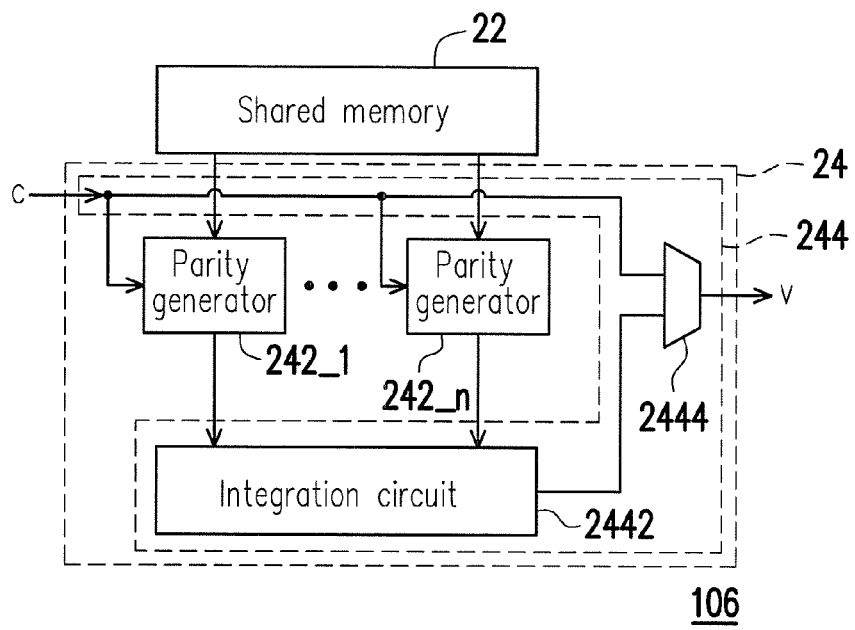
FIG. 2 is a diagram of an encoding module according to an embodiment of the present invention.

FIG. 2 is a diagram of the encoding module 106 in FIG. 1 according to an embodiment of the present invention. Referring to FIG. 2, the encoding module 106 includes a shared memory 22 and a parity generation module 24. The shared memory 22 may be any memory or storage medium, such as a flash memory or a random access memory (RAM). The shared memory 22 stores one or more basic vectors for generating foregoing generation matrix G (or parity matrix P). For example, if the dimensions of the basic vectors stored in the shared memory 22 are all 1×3, each of these basic vectors has three matrix elements or bits (0 or 1) and can be expressed as a 1×3 matrix. In addition, when more than one basic vector are stored in the shared memory 22, the dimensions of the basic vectors may be the same or different, which is not limited in the present invention.

The parity generation module 24, coupled to the shared memory 22, is configured to read one or more basic vectors from the shared memory 22. The parity generation module 24 first determines the dimensions of the basic vectors and then generates a generation matrix G according to the basic vectors with the determined dimensions. The parity generation module 24 includes n parity generators 242_1-242_$n$ and an integrated output circuit 244. The parity generators 242_1-242_$n$ are respectively coupled to the shared memory 22. In an embodiment, the parity generation module 24 does not adjust the dimension of each basic vector but directly generates the generation matrix G (or the parity matrix P) according to the basic vectors read from the shared memory 22. In another embodiment, the parity generation module 24 adjusts the dimension of each basic vector read from the shared memory 22 and generates the generation matrix G (or the parity matrix P) according to the basic vectors with the adjusted dimensions. The adjustment of the dimension of each basic vector is to, preferably, reduce the dimension of the basic vector. The integrated output circuit 244 generates a corresponding codeword v according to a raw data c and one or more encoded data from the parity generators 242_1-242-$n$. It should be noted that the number of the parity generators 242_1-242_$n$ can be determined according to the actual design requirement/product specification. Aforementioned encoded data will be explained later on with reference to FIG. 3. In addition, the basic vectors required by the parity generators 242_1-242_$n$ are all stored in the shared memory 22 instead of being respectively stored in different memories. When the number of the parity generators 242_1-242_$n$ is greater than 1 (i.e., n>1, and n is a positive integer), the parity generators 242_1-242_$n$ sequentially reads the desired basic vectors from the shared memory 22. Thus, the circuit area occupied by memories in a chip is reduced by using a single memory.

In general, the dimension (or bit number) stored in an encoding device during an encoding procedure is usually fixed, and accordingly, the dimension of the corresponding generation matrix G is also fixed, which makes the operation not very flexible. However, in the present embodiment, after the parity generation module 24 reads one or more basic vectors from the shared memory 22, the parity generation module 24 further adaptively adjusts the dimensions of the basic vectors to generate a generation matrix G to satisfy different requirements. For example, assuming that the dimension of all the basic vectors stored in the shared memory 22 is 1×4, after the parity generation module 24 obtains a desired basic vector, the parity generation module 24 adjusts the dimension of the basic vector (for example, reduces to 1×3) and generates the corresponding generation matrix G according to the adjusted basic vector. In an embodiment, when data needs to be quickly accessed, the parity generation module 24 can reduce the dimensions of the basic vectors, so that the data encoding procedure can be sped up through a generation matrix G having a lower dimension (compared to the generation matrix G without dimension adjustment). In another embodiment, when data needs to be accurately stored, the parity generation module 24 does not adjust the dimensions of the basic vectors, so that the data storage accuracy can be increased through a generation matrix G having a higher dimension (compared to the generation matrix with dimension adjustment).

After generating the generation matrix G, the parity generation module 24 converts a raw data c from the host interface 104 into a codeword v through the generation matrix G and outputs the codeword v to the memory interface 102, so as to write the codeword v into the memory chip 11. In an embodiment, the parity matrix P in the generation matrix G is divided into one or more columns presented as matrices, and these one or more columns presented as matrices respectively include one or more submatrices, like $$\begin{bmatrix} 1 & 1 & 0 \\ 0 & 1 & 1 \\ 1 & 0 & 1 \end{bmatrix}.$$

For the convenience of description, each column presented as a matrix is referred to as a submatrix column thereinafter. For example, based on foregoing equation (2), the generation matrix G can be expressed as following equation (3).

$$G=[I|1^{st} \text{ submatrix column } 2^{nd} \text{ submatrix column} \ldots n^{th} \text{ submatrix column}] \quad \text{equation (3)}$$

In foregoing equation (3), the row number of each submatrix column is equal to the row number of the parity matrix P, the column number of each submatrix column is equal to the column number of the submatrices (like $$\begin{bmatrix} 1 & 1 & 0 \\ 0 & 1 & 1 \\ 1 & 0 & 1 \end{bmatrix}$$

aforementioned), the total number of columns of the $1^{st}$ to the $n^{th}$ submatrix column is equal to the column number of the parity matrix P, and the value of n is determined according to the number of the parity generators 242_1-242_$n$. For example, the value of n is equal to the number of the parity generators 242_1-242-$n$. Each of the parity generators 242_1-242_$n$ generates a submatrix column corresponding to the parity matrix P according to one or more adjusted basic vectors, and generates an encoded data according to the product of the raw data c and the submatrix column. Thus, each parity generator in the parity generation module 24 can respectively perform operations on a submatrix column in the parity matrix P, so that the operation load can be distributed and the operation speed can be increased.

Taking two parity generators as an example, herein it is assumed that the parity generation module 24 includes a parity generator 242_1 and a parity generator 242_2, the raw data c has 12 bits (i.e., the dimension of the raw data c is 1×12), and the dimension of the generation matrix G is 12×18, where the dimension of the identity matrix I is 12×12, and the dimension of the parity matrix P is 12×6. The parity matrix P is divided into two submatrix columns (for example, the parity matrix P=[1st submatrix column $2^{nd}$ submatrix column], and the first submatrix column and the second submatrix column in the parity matrix P are respectively divided into 4 submatrices having a dimension of 3×3 (for example, the parity matrix $$P = \begin{bmatrix} [\text{submatrix}] & [\text{submatrix}] \\ [\text{submatrix}] & [\text{submatrix}] \\ [\text{submatrix}] & [\text{submatrix}] \\ [\text{submatrix}] & [\text{submatrix}] \end{bmatrix}.$$

Next, when the parity generation module 24 performs the calculation of the equation (1), the parity generator 242_1 performs binary multiplication and addition operations on the raw data c and the first submatrix column in the parity matrix P to generate a first encoded data, and the parity generator 242_2 performs binary multiplication and addition operations on the raw data c and the second submatrix column in the parity matrix P to generate a second encoded data.

Figure 3:
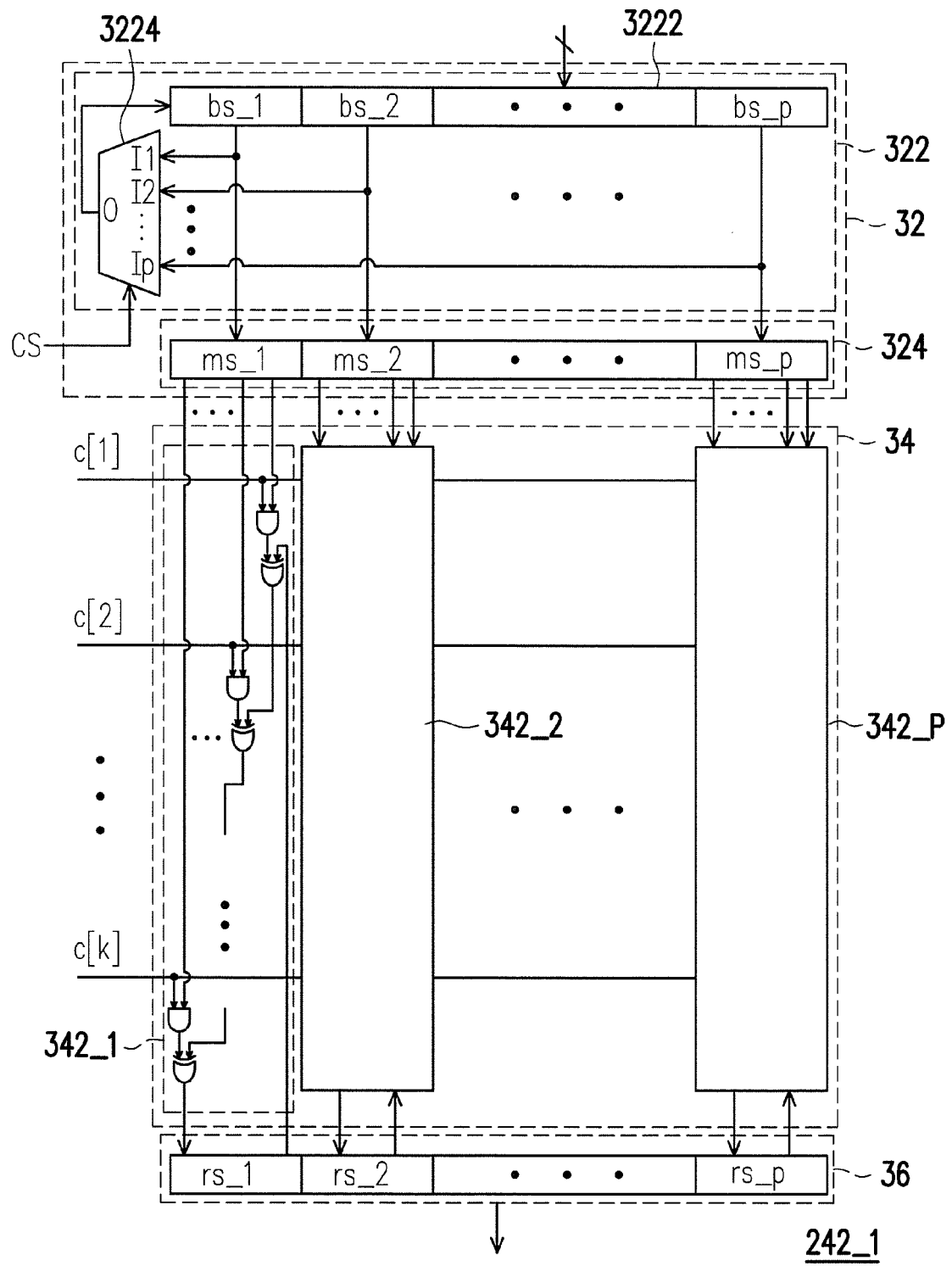
FIG. 3 is a diagram of a parity generator according to an embodiment of the present invention.

In the present embodiment, because the parity generators 242_1-242_n have substantially the same circuit structure, below, the parity generator 242_1 will be described as an example, and when the number of the parity generators 242_1-242_n is greater than 1, the other parity generators 242_2-242_n can be understood by referring to the descriptions of the parity generator 242_1. FIG. 3 is a diagram of the parity generator 242_1 in FIG. 2 according to an embodiment of the present invention. Referring to FIG. 3, the parity generator 242_1 includes a control circuit 32, an operational circuit 34, and a register circuit 36. The control circuit 32 is coupled to the shared memory 22. The control circuit 32 reads one or more basic vectors (the basic vectors read by the parity generator 242_1 will be generally referred to as first basic vectors) from the shared memory 22 and determines the dimensions of the first basic vectors. Then, the control circuit 32 generates a submatrix column (for example, the first submatrix column in the parity matrix P) or a submatrix in the submatrix column of the parity matrix P in the generation matrix G according to the first basic vectors with the determined dimensions. Particularly, in the present embodiment, the row number of a submatrix column generated by the control circuit 32 is equal to the number of bits c[1], c[2], ..., and c[k] in the raw data c, and the submatrix column generated by the control circuit 32 also has k rows.

The bits c[1]-c[k] in FIG. 3 are all or part of the bits in the raw data c. For example, if the raw data c has k bits, the bits c[1]-c[k] respectively represent the 1st to the $k^{th}$ bit of the raw data c. Or, if the raw data c has 2k bits, the bits c[1]-c[k] respectively represent the $1^{st}$ to the $k^{th}$ bit (a first subdata) of the raw data c or respectively represent the $(k+1)^{th}$ bit to the $2k^{th}$ bit (a second subdata) of the raw data c. Namely, when the bit number of the raw data c is greater than k, the raw data c can be divided into a plurality of subdata (the bit number of each subdata is not greater than k). The subdata is sequentially input to the parity generators 242_1-242_n, so that the calculation in foregoing equation (1) on the raw data c can be performed separately.

In the present embodiment, the control circuit 32 includes a shift control circuit 322 and a matrix register circuit 324. The shift control circuit 322 is coupled to the shared memory 22. The shift control circuit 322 reads aforementioned one or more first basic vectors from the shared memory 22. Particularly, the shift control circuit 322 determines the dimensions of the first basic vectors according to a control signal CS and performs at least one shifting operation on the first basic vectors with the determined dimensions to generate the corresponding submatrix columns.

For example, herein it is assumed that the shift control circuit 322 obtains a first basic vector from the shared memory 22, and the bits c[1]-c[k] in FIG. 3 are 12 bits. After determining the dimension of the first basic vector, the shift control circuit 322 performs 11 shifting operations according to the first basic vector to generate a submatrix column (or submatrices) having 12 rows. Taking [a1 a2 a3] as an example of the first basic vector, the control circuit 32 performs 11 shifting operations (for example, rightward shifting operations) on [a1 a2 a3] to generate [a3 a1 a2], [a2 a3 a1], [a1 a2 a3], [a3 a1 a2], [a2 a3 a1], [a1 a2 a3], [a3 a1 a2], and [a2 a3 a1] sequentially and accordingly obtains the corresponding submatrix column (or submatrices in the submatrix column)

$$\begin{bmatrix} a1 & a2 & a3 \\ a3 & a1 & a2 \\ a2 & a3 & a1 \\ a1 & a2 & a3 \\ a3 & a1 & a2 \\ a2 & a3 & a1 \\ a1 & a2 & a3 \\ a3 & a1 & a2 \\ a2 & a3 & a1 \\ a1 & a2 & a3 \\ a3 & a1 & a2 \\ a2 & a3 & a1 \end{bmatrix}.$$

However, in another embodiment, the shift control circuit 322 may also obtain multiple first basic vectors from the shared memory 22. For example, assuming that 4 first basic vectors are obtained and the 4 first basic vectors are respectively [a1 a2 a3], [b1 b2 b3], [c1 c2 c3], and [d1 d2 d3], after the shift control circuit 322 determines the dimensions of the 4 first basic vectors, the shift control circuit 322 respectively performs two shifting operations on the 4 first basic vectors to generate 4 3×3 submatrices, and accordingly obtains a submatrix column which is composed of the 4 submatrices and has 12 rows (i.e., the dimension thereof is 12×3), such as $$\begin{bmatrix} \begin{bmatrix} a1 & a2 & a3 \\ a3 & a1 & a2 \\ a2 & a3 & a1 \end{bmatrix} \\ \begin{bmatrix} b1 & b2 & b3 \\ b3 & b1 & b2 \\ b2 & b3 & b1 \end{bmatrix} \\ \begin{bmatrix} c1 & c2 & c3 \\ c3 & c1 & c2 \\ c2 & c3 & c1 \end{bmatrix} \\ \begin{bmatrix} d1 & d2 & d3 \\ d3 & d1 & d2 \\ d2 & d3 & d1 \end{bmatrix} \end{bmatrix}.$$

To be specific, the shift control circuit 322 includes a basic vector register circuit 3222 and a shift multiplexer 3224. The basic vector register circuit 3222 is coupled to the shared memory 22 and the matrix register circuit 324 and has bit storage areas bs_1, bs_2, ..., and bs_p, where the bit storage areas bs_1-bs_p are respectively configured to store bits of the first basic vectors from the shared memory 22. For example, if the obtained first basic vector has 4 bits, the 4 bits are sequentially stored in the bit storage areas bs_1-bs_4 of the shift control circuit 322.

The shift multiplexer 3224 receives the control signal CS and selectively reads a specific bit from the first basic vector stored in the basic vector register circuit 3222 according to the control signal CS, so as to determine the dimension of the first basic vector and perform the corresponding shifting operation. For example, as shown in FIG. 3, the basic vector register circuit 3222 has an input terminal and a plurality of output terminals, where the output terminals are respectively configured to output the bits stored in the bit storage areas bs_1-bs_p. The basic vector register circuit 3222 can perform a rightward shifting operation (for example, transmit the content in the bit storage area bs_1 to the bit storage area bs_2, and so on). The shift multiplexer 3224 has input terminals I1-Ip and an output terminal O. The input terminals I1-Ip are respectively coupled to the output terminals of the basic vector register circuit 3222, and the output terminal O is coupled to the input terminal of the basic vector register circuit 3222. In each shifting operation, the shift multiplexer 3224 selectively reads a specific bit from the bit storage areas bs_1-bs_p through one of the input terminals I1-Ip according to the control signal CS and sends the specific bit back to the bit storage area bs_1 of the basic vector register circuit 3222 through the output terminal O, so as to perform a shifting operation on the first basic vector stored in the basic vector register circuit 3222, and the shift multiplexer 3224 serves the result of the shifting operation as one row in the generated submatrix column.

For example, when the shift multiplexer 3224 connects the input terminal I2 and the output terminal O according to the control signal CS, the shift multiplexer 3224 obtains the specific bit stored in the bit storage area bs_2 (i.e., the $2^{nd}$ bit of the first basic vector) and sends the obtained specific bit back to the input terminal of the basic vector register circuit 3222 through the output terminal O. After the basic vector register circuit 3222 receives the specific bit originally stored in the bit storage area bs_2 through its input terminal, the basic vector register circuit 3222 writes the bit originally stored in the bit storage area bs_1 into the bit storage area bs_2 and writes the received specific bit into the bit storage area bs_1 to complete a shifting operation. After that, the basic vector register circuit 3222 outputs the bits stored in the bit storage areas bs_1-bs_2.

Assuming that the original dimension of the first basic vector is 1×4 and the shift control circuit 322 is about to generate a submatrix column having 3 columns, the shift multiplexer 3224 reads the $3^{rd}$ bit of the first basic vector and sends the $3^{rd}$ bit back to the input terminal of the basic vector register circuit 3222. Thus, the shift control circuit 322 can adjust the dimension of the first basic vector to 1×3 and perform a shifting operation on the first basic vector stored in the basic vector register circuit 3222 at the same time.

The matrix register circuit 324 is coupled to the shift control circuit 322 and the operational circuit 34. The matrix register circuit 324 stores the submatrix columns generated by the control circuit 322. To be specific, the matrix register circuit 324 has matrix storage areas ms_1-ms_p respectively receiving and storing bit data from the bit storage area bs_1-bs_p. In the exemplary embodiment described above, every time after a shifting operation is performed, the matrix storage areas ms_1-ms_3 respectively store bit data from the bit storage areas bs_1-bs_3. After several shifting operations are performed, the matrix storage areas ms_1-ms_3 respectively record the columns in the submatrix column on which the shifting operations will be performed. For example, the matrix storage area ms_1 stores the first column (i.e., $$\begin{bmatrix} a1 \\ a3 \\ a2 \\ a1 \\ a3 \\ a2 \\ a1 \\ a3 \\ a2 \\ a1 \\ a3 \\ a2 \end{bmatrix})$$

of the submatrix column $$\begin{bmatrix} a1 & a2 & a3 \\ a3 & a1 & a2 \\ a2 & a3 & a1 \\ a1 & a2 & a3 \\ a3 & a1 & a2 \\ a2 & a3 & a1 \\ a1 & a2 & a3 \\ a3 & a1 & a2 \\ a2 & a3 & a1 \\ a1 & a2 & a3 \\ a3 & a1 & a2 \\ a2 & a3 & a1 \end{bmatrix},$$

the matrix storage area ms_2 stores the second column (i.e., $$\begin{bmatrix} a2 \\ a1 \\ a3 \\ a2 \\ a1 \\ a3 \\ a2 \\ a1 \\ a3 \\ a2 \\ a1 \\ a3 \end{bmatrix}),$$

and the matrix storage area ms_3 stores the third column (i.e., $$\begin{bmatrix} a3 \\ a2 \\ a1 \\ a3 \\ a2 \\ a1 \\ a3 \\ a2 \\ a1 \\ a3 \\ a2 \\ a1 \end{bmatrix}),$$

Or, the matrix storage area ms_1 stores the first column (i.e., $$\begin{bmatrix} \begin{bmatrix} a1 \\ a3 \\ a2 \end{bmatrix} \\ \begin{bmatrix} b1 \\ b3 \\ b2 \end{bmatrix} \\ \begin{bmatrix} c1 \\ c3 \\ c2 \end{bmatrix} \\ \begin{bmatrix} d1 \\ d3 \\ d2 \end{bmatrix} \end{bmatrix})$$

of the submatrix column $$\begin{bmatrix} \begin{bmatrix} a1 & a2 & a3 \\ a3 & a1 & a2 \\ a2 & a3 & a1 \end{bmatrix} \\ \begin{bmatrix} b1 & b2 & b3 \\ b3 & b1 & b2 \\ b2 & b3 & b1 \end{bmatrix} \\ \begin{bmatrix} c1 & c2 & c3 \\ c3 & c1 & c2 \\ c2 & c3 & c1 \end{bmatrix} \\ \begin{bmatrix} d1 & d2 & d3 \\ d3 & d1 & d2 \\ d2 & d3 & d1 \end{bmatrix} \end{bmatrix},$$

the matrix storage area ms_2 stores the second column (i.e., $$\begin{bmatrix} \begin{bmatrix} a2 \\ a1 \\ a3 \end{bmatrix} \\ \begin{bmatrix} b2 \\ b1 \\ b3 \end{bmatrix} \\ \begin{bmatrix} c2 \\ c1 \\ c3 \end{bmatrix} \\ \begin{bmatrix} d2 \\ d1 \\ d3 \end{bmatrix} \end{bmatrix}),$$

and the matrix storage area ms_3 stores the third column (i.e., $$\begin{bmatrix} \begin{bmatrix} a3 \\ a2 \\ a1 \end{bmatrix} \\ \begin{bmatrix} b3 \\ b2 \\ b1 \end{bmatrix} \\ \begin{bmatrix} c3 \\ c2 \\ c1 \end{bmatrix} \\ \begin{bmatrix} d3 \\ d2 \\ d1 \end{bmatrix} \end{bmatrix}).$$

The operational circuit 34 is coupled to the control circuit 32. The operational circuit 34 converts the bits c[1]-c[k] into an encoded data (for example, aforementioned first encoded data) through the columns (for example, aforementioned first to third columns) generated by the control circuit 32. For example, the operational circuit 34 includes sub operational circuits 342_1, 342_2, . . . , and 342_p. The sub operational circuits 342_1-342_p respectively include a plurality of AND gates and a plurality of XOR gates (the structure thereof is similar to the sub operational circuit 342_1 illustrated in FIG. 3), such that the sub operational circuits 342_1-342_p can perform operations on the bits c[1]-c[k] through the columns stored in the matrix storage areas ms_1-ms_p to generate each bit in the encoded data.

The register circuit 36 is coupled to the operational circuit 34. The register circuit 36 stores the encoded data (i.e., the first encoded data) generated by the operational circuit 34.

For example, the register circuit 36 includes registers rs_1, rs_2, . . . , and rs_p for respectively storing the bits of the first encoded data output by the sub operational circuits 342_1-342_p. In another embodiment, if the raw data is c[1]-c[2k], a first part encoded data is obtained from the first operation performed by the operational circuit 34 on the bits c[1]-c[k], and the first part encoded data is stored in the register circuit 36. Besides, the first part encoded data stored in the register circuit 36 is sent back to the operational circuit 34 and added to a second part encoded data obtained through a second operation performed on the bits c[k+1]-c[2k] to obtain the complete first encoded data. The complete first encoded data is stored into the register circuit 36. Based on the circuit structure illustrated in FIG. 3, assuming that the raw data c is c[1:k], in the present embodiment, it is not necessary to perform a binary multiplication and addition operation on any single bit of the c[1:k] every time when a row in a submatrix column is generated. Instead, binary multiplication and addition operations are simultaneously performed on the bits of the c[1:k] through a complete submatrix column or a plurality of rows in the submatrix column after the control circuit 32 generates the submatrix column or the rows in the submatrix column, so that the encoding efficiency is greatly improved.

Referring to FIG. 2 again, the integrated output circuit 244 generates a corresponding codeword v according to the raw data c and one or more encoded data from the parity generators 242_1-242-n. For example, the integrated output circuit 244 includes an integration circuit 2442 and a multiplexer 2444. In foregoing example with the assumption of the parity matrix $$P = \begin{bmatrix} [\text{submatrix}] & [\text{submatrix}] \\ [\text{submatrix}] & [\text{submatrix}] \\ [\text{submatrix}] & [\text{submatrix}] \\ [\text{submatrix}] & [\text{submatrix}] \end{bmatrix},$$

the integration circuit 2442 integrates the first encoded data from the parity generator 242_1 and the second encoded data from the parity generator 242_2, and outputs the integrated encoded data to the multiplexer 2444 as the ECC of the raw data. The multiplexer 2444 receives the raw data c from the host system 12 and the sorted first and second encoded data, which is the ECC of the raw data, and sequentially outputs the same as the codeword v. When the raw data is input to the encoding module 106 to be encoded, the multiplexer 2444 can output the raw data c from the host system 12 as the front part of the codeword v. After the parity generators 242_1-242-n finish the encoding process, the multiplexer 2444 can serve the ECC output by the integration circuit 2442 as the rear part of the codeword v. To be specific, following equation (4) is obtained by combining foregoing equation (3) and equation (1).

$$\begin{aligned} v &= cG \qquad\qquad\qquad\qquad\qquad\qquad\qquad\qquad \text{equation (4)} \\ &= c[I \mid P] \\ &= c[I \mid 1^{st} \text{ submatrix column } 2^{nd} \text{ submatrix column} \ldots n^{th} \text{ submatrix column}] \\ &= c \mid [c \times 1^{st} \text{ submatrix column } c \times 2^{nd} \text{ submatrix column} \ldots c^* n^{th} \text{ submatrix column}] \end{aligned}$$

Taking the two parity generators (242_1 and 242_2) generate the first encoded data and the second encoded data as an example, the equation (4) can be represented as v=c|[c×1$^{st}$ submatrix column c×2$^{nd}$ submatrix column]. The first encoded data generated by the parity generator 242_1 is "c×1$^{st}$ submatrix column" in foregoing equation (4), and the second encoded data generated by the parity generator 242_2 is "c×2$^{nd}$ submatrix column" in foregoing equation (4).

Referring to FIG. 1 again, the decoding module 108 decodes the codeword from the memory interface 102 through a check matrix H. The check matrix H conforms to a calculational rule of HG=0 (i.e., a zero matrix). Particularly, because there may be noise interference when the codeword v is read from the memory chip 11, the codeword v is usually decoded according to a decision ratio matrix corresponding to the codeword v. In other words, the decision ratio matrix corresponding to the codeword v can help to determine the raw data c before it is encoded into the codeword v and reduce errors in the decoding process caused by the noise interference. For example, assuming that the codeword from the memory interface 102 has 9 bits, the corresponding decision ratio matrix is then expressed as $$\begin{bmatrix} \gamma_1 & \gamma_2 & \gamma_3 \\ \gamma_4 & \gamma_5 & \gamma_6 \\ \gamma_7 & \gamma_8 & \gamma_9 \end{bmatrix},$$

where $\gamma_1$-$\gamma_9$ are respectively the decision ratios of the first to the ninth bit of the codeword v. The decision ratio corresponding to a bit is a ratio of the probability of the bit being 0 to the probability of the bit being 1. The decision ratio can be determined according to the actual design requirement. In the present embodiment, assuming that the probability of the first bit in the codeword v read from the memory chip 11 through the memory interface 102 being 0 is Pr(0) and the probability of the same bit in the same codeword v being 1 is Pr(1), the decision ratio of the first bit in the codeword v can be defined as log [Pr(0)/Pr(1)] (also referred to as a log-likelihood ratio). For example, $\gamma_1$=log(the probability of the first bit in the codeword being 0/the probability of the first bit in the codeword being 1), and the other decision ratios $\gamma_2$-$\gamma_9$ can be defined similarly.

Figure 4:
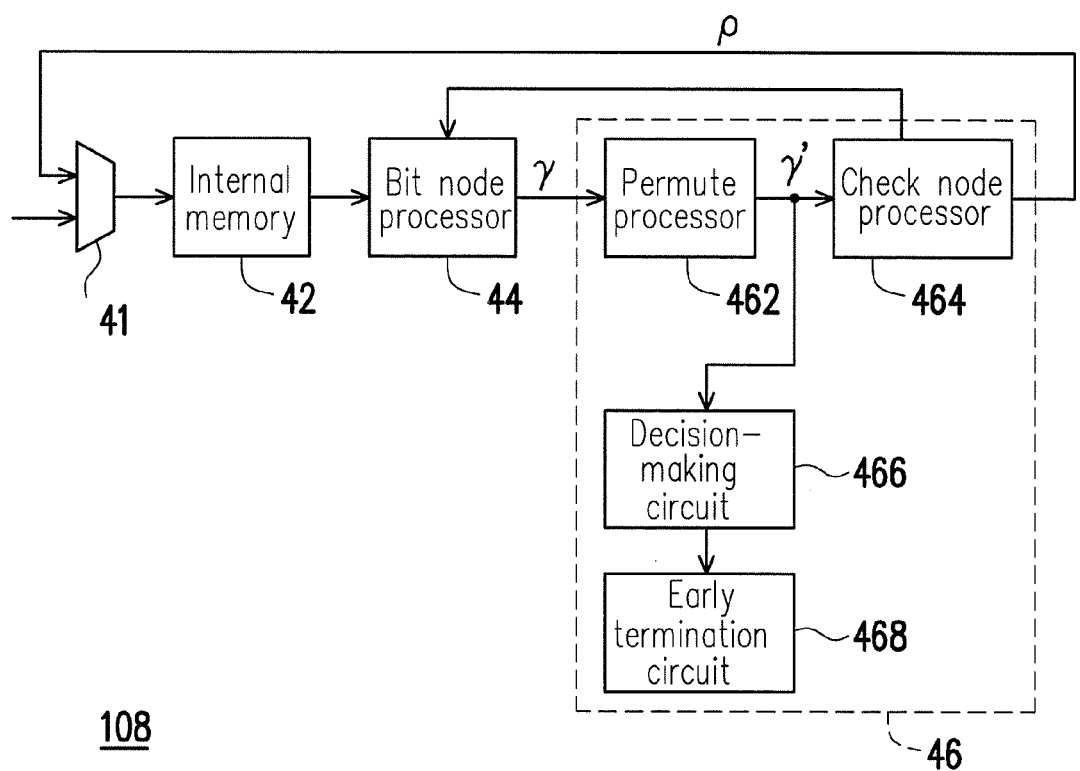
FIG. 4 is a diagram of a decoding module according to an embodiment of the present invention.

FIG. 4 is a diagram of a decoding module according to an embodiment of the present invention. Referring to FIG. 4, the decoding module 108 includes a multiplexer 41, an internal memory 42, a bit node processor 44, and a check module 46. The internal memory 42 receives and stores the decision ratio matrix corresponding to the codeword v from the memory interface 102 through the multiplexer 41. The input terminal of the bit node processor 44 is coupled to the output terminal of the internal memory 42 so that the bit node processor 44 can read data (for example, the decision ratio matrix) from the internal memory 42. In other words, in the present embodiment, the bit node processor 44 obtains the decision ratio matrix from the internal memory 42 and then transmits the decision ratio matrix to the check module 46 for further operations. A first output terminal of the check module 46 is coupled to the input terminal of the internal memory 42 through the multiplexer 41, and the input terminal of the check module 46 is coupled to the output terminal of the bit node processor 44. The check module 46 performs an iterative calculation on the decision ratio matrix from the bit node processor 44 through the check matrix H to update the decision ratio matrix stored in the internal memory 42, and the check module 46 generates a modification matrix according to the result of the iterative calculation.

In the present embodiment, each iterative calculation includes permutation and update operations on the decision ratio matrix, and each iterative calculation includes a plurality of simultaneously executed periodic operations. Each periodic operations is performed regarding one row in the decision ratio matrix. For example, the check module 46 includes a permute processor 462 and a check node processor 464. The input terminal of the permute processor 462 is coupled to the output terminal of the bit node processor 44. The permute processor 462 permutes the decision ratio matrix from the bit node processor 44 according to the check matrix H. For example, the permute processor 462 permutes the elements of the first to the third rows of the decision ratio matrix $\gamma$ in unit of rows. Assuming the initial value of the decision ratio matrix $\gamma$ stored in the internal memory 42 is $$\begin{bmatrix} \gamma_1 & \gamma_2 & \gamma_3 \\ \gamma_4 & \gamma_5 & \gamma_6 \\ \gamma_7 & \gamma_8 & \gamma_9 \end{bmatrix}$$

and the check matrix $$H = \begin{bmatrix} 100010001 \\ 010001100 \\ 001100010 \\ \vdots \end{bmatrix}.$$

In the operation of reading the initial values, the bit node processor 44 does not process the initial value of the decision ratio matrix $\gamma$ read from the internal memory 42 but transmits the initial value to the permute processor 462. According to a first submatrix $$\begin{bmatrix} 1 & 0 & 0 \\ 0 & 1 & 0 \\ 0 & 0 & 1 \end{bmatrix}$$

of the check matrix H, the permute processor 462 adjusts the first row [$\gamma_1$ $\gamma_2$ $\gamma_3$] of the initial value of the decision ratio matrix $\gamma$ into [$\gamma_1$ $\gamma_2$ $\gamma_3$]. According to a second submatrix $$\begin{bmatrix} 0 & 1 & 0 \\ 0 & 0 & 1 \\ 1 & 0 & 0 \end{bmatrix}$$

of the check matrix H, the permute processor 462 adjusts the second row [$\gamma_4$ $\gamma_5$ $\gamma_6$] of the initial value of the decision ratio matrix $\gamma$ into [$\gamma_5$ $\gamma_6$ $\gamma_4$]. According to a third submatrix $$\begin{bmatrix} 0 & 0 & 1 \\ 1 & 0 & 0 \\ 0 & 1 & 0 \end{bmatrix}$$

of the check matrix H, the permute processor 462 adjusts the third row $[\gamma_8\ \gamma_8\ \gamma_9]$ of the initial value of the decision ratio matrix $\gamma$ into $[\gamma_9\ \gamma_7\ \gamma_8]$. Thus, through the permutation operations of the permute processor 462 in unit of rows, the decision ratio matrix $\gamma$ is transformed into $\gamma'$, and $$\gamma' = \begin{bmatrix} \gamma_1 & \gamma_2 & \gamma_3 \\ \gamma_5 & \gamma_6 & \gamma_4 \\ \gamma_9 & \gamma_7 & \gamma_8 \end{bmatrix}.$$

The input terminal of the check node processor 464 is coupled to the output terminal of the permute processor 462, a first output terminal of the check node processor 464 is coupled to the input terminal of the internal memory 42, and a second output terminal of the check node processor 464 is coupled to a second input terminal of the bit node processor 44. The check node processor 464 updates the decision ratio matrix stored in the internal memory 42 according to the permuted decision ratio matrix $\gamma'$ and generates aforementioned modification matrix for the bit node processor 44. In the present embodiment, the check node processor 464 includes 3 check node processing modules (i.e., first, second and third check node processing modules). After the permute processor 462 generates the permuted decision ratio matrix $\gamma'$, the first check node processing module of the check node processor 464 updates elements in the first column of the decision ratio matrix $\gamma'$ (i.e., $$\begin{bmatrix} \gamma_1 \\ \gamma_5 \\ \gamma_8 \end{bmatrix}),$$

the second check node processing module of the check node processor 464 updates elements in the second column of the decision ratio matrix $\gamma'$ (i.e., $$\begin{bmatrix} \gamma_2 \\ \gamma_6 \\ \gamma_7 \end{bmatrix}),$$

and the third check node processing module of the check node processor 464 updates elements in the third column of the decision ratio matrix $\gamma'$ (i.e., $$\begin{bmatrix} \gamma_3 \\ \gamma_4 \\ \gamma_8 \end{bmatrix}).$$

To be specific, in the first periodic operation of an iterative calculation, the first check node processing module deducts a correction value $\lambda_{00}$ from $\gamma_1$ to generate $\rho_{00}$, the check node processing module deducts a correction value $\lambda_{01}$ from $\gamma_2$ to generate $\rho_{o1}$, and the third check node processing module deducts a correction value $\lambda_{02}$ from $\gamma_3$ to generate $\rho_{02}$. Particularly, in the first iterative calculation, because the correction values $\lambda_{00}, \lambda_{01}$, and $\lambda_{02}$ are all initial values (for example, 0), there are $\rho_{00}=\gamma_1-\lambda_{00}=\gamma_1$, $\rho_{01}=\gamma_2-\lambda_{01}=\gamma_2$, and $\rho_{02}=\gamma_3-\lambda_{02}=\gamma_3$. After generating $\rho_{00}, \rho_{o1}$, and $\rho_{02}$, the check node processor 464 respectively updates $\gamma_1, \gamma_2$, and $\gamma_3$ in the decision ratio matrix $\gamma$ stored in the internal memory 42 into $\rho_{00}$, $\rho_{01}$, and $\rho_{02}$.

In the second periodic operation of a iterative calculation, the first check node processing module deducts a correction value $\lambda_{11}$ from $\gamma_5$ to generate $\rho_{11}$, the second check node processing module deducts a correction value $\lambda_{12}$ from $\gamma_6$ to generate $\rho_{12}$, and the third check node processing module deducts a correction value $\lambda_{10}$ from $\gamma_4$ to generate $\rho_{10}$. Similarly, because this is the first iterative calculation, the correction values $\lambda_n, \lambda_{12}$, and $\lambda_{10}$ are all initial values (for example, 0), there are $\rho_{11}=\gamma_5-\lambda_{11}=\gamma_5$, $\rho_{12}=\gamma_6-\gamma_{12}=\gamma_6$ and $\rho_{10}=\gamma_4-\lambda_{10}=\gamma_4$. After generating $\rho_{11}$, $\rho_{12}$ and $\rho_{10}$, the check node processor 464 respectively updates $\gamma_5, \gamma_6$, and $\gamma_4$ in the decision ratio matrix $\gamma$ stored in the internal memory 42 into $\rho_{11}$, $\rho_{12}$, and $\rho_{10}$.

In the third periodic operation of an iterative calculation, the first check node processing module deducts a correction value $\lambda_{22}$ from $\gamma_9$ to generate $\rho_{22}$, the second check node processing module deducts a correction value $\lambda_{20}$ from $\gamma_7$ to generate $\rho_{20}$, and the third check node processing module deducts a correction value $\lambda_{21}$ from $\gamma_8$ to generate $\rho_{21}$. Similarly, because this is the first iterative calculation, the correction values $\lambda_{22}, \lambda_{20}$, and $\lambda_{21}$ are all initial values (for example, 0), there are $\rho_{22}=\gamma_9-\lambda_{22}=\gamma_9$, $\rho_{20}=\gamma_7=\lambda_{20}=\gamma_7$, and $\rho_{21}=\gamma_8-\lambda_{21}=\gamma_8$. After generating $\rho_{22}, \rho_{20}$, and $\rho_{21}$, the check node processor 464 respectively updates $\gamma_9, \gamma_7$, and $\gamma_8$ in the decision ratio matrix $\gamma$ stored in the internal memory 42 into $\rho_{22}$, $\rho_{20}$, and $\rho_{21}$.

It should be mentioned that because the check node processor 464 can directly write the generated decision ratio matrix into the internal memory 42 without going through the bit node processor 44, the bit node processor 44 doesn't need any additional storage space for storing the decision ratio matrix generated by the check node processor 464. Thus, the hardware cost of the bit node processor 44 can be reduced.

After finishing three periodic operations in the iterative calculation, the check node processor 464 generates a modification matrix $\lambda$ according to the updated decision ratio matrix $\rho$. In the present embodiment, a specific element in the modification matrix $\lambda$ may be determined according to the minimum value among the absolute values of the other elements in the same column as the specific element in the updated decision ratio matrix. For example, assuming that the updated decision ratio matrix $$\rho = \begin{bmatrix} \rho_{00} & \rho_{01} & \rho_{02} \\ \rho_{10} & \rho_{11} & \rho_{12} \\ \rho_{20} & \rho_{21} & \rho_{22} \end{bmatrix} = \begin{bmatrix} -6 & 5 & 1 \\ 1 & 2 & 2 \\ 2 & 3 & 2 \end{bmatrix},$$

the modification matrix $\lambda$ generated by the check node processor 464 is then $$\begin{bmatrix} \lambda_{00} & \lambda_{01} & \lambda_{02} \\ \lambda_{10} & \lambda_{11} & \lambda_{12} \\ \lambda_{20} & \lambda_{21} & \lambda_{22} \end{bmatrix} = \begin{bmatrix} 1 & 2 & 2 \\ 2 & 3 & 1 \\ 1 & 2 & 1 \end{bmatrix},$$

where $\lambda_{00}=\min(|\rho_{10}|, |\rho_{20}|)$, $\lambda_{10}=\min(|\rho_{00}|, |\rho_{20}|)$, $\lambda_{20}=\min(|\rho_{00}|, |\rho_{10}|)$, $\gamma_{01}=\min(|\rho_{11}|, |\rho_{21}|)$, $\lambda_{11}=\min(|\rho_{01}|, |_{21}|)$ $\lambda_{21}=\min(|_{01}|, |\rho_{11}|)$, $\lambda_{02}=\min(|\rho_{12}|, |\rho_{22}|)$, $\lambda_{12}=\min(|\rho_{02}|, |\rho_{22}|)$, and $\lambda_{22}=\min(|\rho_{02}|, |\rho_{12}|)$.

After the check node processor 464 generates the modification matrix $\lambda$, the check node processor 464 transmits the modification matrix λ to the bit node processor 44. Then, the bit node processor 44 modifies the updated decision ratio matrix ρ read from the internal memory 42 according to the modification matrix λ. For example, the bit node processor 44 reads the updated decision ratio matrix ρ from the internal memory 42 and adds the modification matrix λ to the updated decision ratio matrix ρ to generate the modified decision ratio matrix γ, where $$\gamma = \rho + \lambda = \begin{bmatrix} \rho_{00} + \lambda_{00} & \rho_{01} + \lambda_{01} & \rho_{02} + \lambda_{02} \\ \rho_{10} + \lambda_{10} & \rho_{11} + \lambda_{11} & \rho_{12} + \lambda_{12} \\ \rho_{20} + \lambda_{20} & \rho_{21} + \lambda_{21} & \rho_{22} + \lambda_{22} \end{bmatrix}.$$

Assuming that the original decision ratio matrix $$\gamma = \begin{bmatrix} -6 & 5 & 1 \\ 2 & 1 & 2 \\ 3 & 2 & 2 \end{bmatrix},$$

the updated decision ratio matrix $$\rho = \begin{bmatrix} -6 & 5 & 1 \\ 1 & 2 & 2 \\ 2 & 3 & 2 \end{bmatrix},$$

and the modification matrix $$\lambda = \begin{bmatrix} 1 & 2 & 2 \\ 2 & 3 & 1 \\ 1 & 2 & 1 \end{bmatrix},$$

then the modified decision ratio matrix $$\gamma = \begin{bmatrix} -5 & 7 & 3 \\ 3 & 5 & 3 \\ 3 & 5 & 3 \end{bmatrix}.$$

Additionally, the check module 46 may further determine whether to perform another iterative calculation according to the decision ratio matrix γ modified by the bit node processor 44. If the check module 46 determines not to perform another iterative calculation, the check module 46 generates a decoded data according to the modified decision ratio matrix γ and transmits the decoded data to the host interface 104. For example, the check module 46 further includes a decision-making circuit 466 and an early termination circuit 468. The decision-making circuit 466 is coupled to the permute processor 462. The decision-making circuit 466 makes a hard decision on the decision ratio matrix modified by the bit node processor 44 to obtain a decision matrix X. For example, those elements in the modified decision ratio matrix γ that are smaller than 0 are converted into 1, and those elements in the modified decision ratio matrix γ that are greater than 0 are converted into 0 to obtain the decision matrix X. In the example described above, assuming that the modified decision ratio matrix $$\gamma = \begin{bmatrix} -5 & 7 & 3 \\ 3 & 5 & 3 \\ 3 & 5 & 3 \end{bmatrix},$$

the decision-making circuit 466 generates a decision matrix X=[1 0 0 0 0 0 0 0 0] having a dimension of 1×9 after making the hard decision.

The early termination circuit 468 is coupled to the decision-making circuit 466. The early termination circuit 468 determines whether the decision matrix X conforms to the calculational rule of $HX^T=0$. If the decision matrix X conforms to the calculational rule of $HX^T=0$, the early termination circuit 468 determines that the check module 46 does not perform another iterative calculation, and the check module 46 transmits the decision matrix X to the host interface 104 as a decoded data. On the other hand, if the early termination circuit 468 determines that the decision matrix X does not conform to the calculational rule of $HX^T=0$, the check module 46 performs another iterative calculation according to the decision ratio matrix γ modified by the bit node processor 44. Particularly, in the present embodiment, the check node processor 464 uses 0 as the initial value of the modification matrix λ only when the first iterative calculation is performed. While in the second iterative calculation, the check node processor 464 modifies the decision ratio matrix γ provided by the bit node processor 44 by using the modification matrix λ obtained in the previous iterative calculation to obtain the decision ratio matrix ρ (i.e., ρ=γ−λ), and the check node processor 464 updates the modification matrix λ again after it finishes another iterative calculation.

As described above, in a memory controller provided by an embodiment of the present invention, an encoding module adaptively adjusts the dimension of a generation matrix, and a single memory is used to reduce the number of memories. Additionally, in a memory controller provided by an embodiment of the present invention, every time after an iterative calculation is performed, a decoding module determines whether to perform another iterative calculation. Thus, even though a predetermined number of iterations is not reached, the iterative calculation is terminated as long as the result of the iterative calculation satisfies the requirement of the application, so that the decoding efficiency is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory controller, comprising:
   a memory interface, configured to couple to at least one memory chip; and
   an encoding module, coupled to the memory interface, wherein the encoding module comprises:
   a shared memory; and
   a parity generation module, coupled to the shared memory, reading at least one basic vector from the shared memory, determining a dimension of the at least one basic vector, generating a generation matrix according to the at least one basic vector with the determined dimension, converting a raw data into a codeword through the generation matrix, and storing the codeword into the at least one memory chip through the memory interface.

2. The memory controller according to claim 1, wherein the parity generation module comprises at least one parity generator, and the at least one parity generator is respectively coupled to the shared memory,
wherein when a number of the at least one parity generator is greater than 1, the parity generators sequentially read the at least one basic vector from the shared memory.

3. The memory controller according to claim 1, wherein the parity generation module comprises at least one parity generator and an integrated output circuit,
wherein each of the at least one parity generator comprises:
a control circuit, coupled to the shared memory, reading at least one first basic vector among the at least one basic vector from the shared memory, determining a dimension of the at least one first basic vector, and generating a submatrix column of the generation matrix according to the at least one first basic vector with the determined dimension;
an operational circuit, coupled to the control circuit, and converting the raw data into an encoded data through the submatrix column; and
a register circuit, coupled to the operational circuit, and storing the encoded data or a partial encoded data generated by the operational circuit according to the raw data,
wherein the integrated output circuit outputs the codeword according to the raw data and the at least one encoded data from the at least one parity generator.

4. The memory controller according to claim 3, wherein the control circuit comprises:
a shift control circuit, coupled to the shared memory, reading the at least one first basic vector from the shared memory, determining the dimension of the at least one first basic vector according to a control signal, and performing a shifting operation on the at least one first basic vector with the determined dimension to generate the submatrix column; and
a matrix register circuit, coupled to the shift control circuit and the operational circuit, and storing the submatrix column.

5. The memory controller according to claim 4, wherein the shift control circuit comprises:
a basic vector register circuit, coupled to the shared memory and the matrix register circuit, and storing the at least one first basic vector from the shared memory; and
a shift multiplexer, having a plurality of input terminals coupled to a plurality of output terminals of the basic vector register circuit, and having an output terminal coupled to an input terminal of the basic vector register circuit,
wherein the shift multiplexer selectively reads a specific bit from the at least one first basic vector according to the control signal through one of the input terminals of the shift multiplexer to determine the dimension of the at least one first basic vector, and the shift multiplexer sends the at least one specific bit back to the basic vector register circuit through the output terminal of the shift multiplexer to perform the shifting operation on the at least one first basic vector with the determined dimension.

6. The memory controller according to claim 1, wherein the parity generation module calculates v=cG, wherein c represents the raw data, G represents the generation matrix, and v represents the codeword.

7. A memory controller, comprising:
a memory interface, configured to couple to a memory chip;
a decoding module, coupled to the memory interface, wherein the decoding module comprises:
an internal memory, storing a decision ratio matrix corresponding to a codeword from the memory interface;
a bit node processor, coupled to the internal memory, and reading the decision ratio matrix from the internal memory; and
a check module, coupled to the internal memory and the bit node processor, performing an iterative calculation on the decision ratio matrix from the bit node processor through a check matrix to update the decision ratio matrix stored in the internal memory, and generating a modification matrix according to a result of the iterative calculation,
wherein the bit node processor modifies the updated decision ratio matrix read from the internal memory according to the modification matrix, and the check module determines whether to perform the iterative calculation again according to the modified decision ratio matrix, wherein when the check module determines not to perform the iterative calculation again, the check module generates a decoded data according to the modified decision ratio matrix.

8. The memory controller according to claim 7, wherein the check module comprises:
a permute processor, coupled to the bit node processor, and permuting the decision ratio matrix from the bit node processor according to the check matrix;
a check node processor, coupled to the permute processor, the internal memory, and the bit node processor, updating the decision ratio matrix stored in the internal memory according to the permuted decision ratio matrix, and generating the modification matrix.

9. The memory controller according to claim 7, wherein the check module comprises:
a decision-making circuit, coupled to the bit node processor, and making a hard decision on the decision ratio matrix modified by the bit node processor to obtain a decision matrix; and
an early termination circuit, coupled to the decision-making circuit, and determining whether the decision matrix conforms to an calculational rule of $HX^T=0$, wherein H represents the check matrix, and X represents the decision matrix,
wherein when the decision matrix conforms to the calculational rule, the early termination circuit determines that the check module does not perform the iterative calculation again, and the check module transmits the decision matrix to a host interface as the decoded data.

10. The memory controller according to claim 7, wherein the codeword conforms to a calculational rule of v=cG, and the check matrix conforms to a calculational rule of HG=0, wherein c represents a raw data, G represents a generation matrix, v represents the codeword, and H represents the check matrix.

11. The memory controller according to claim 7 further comprising:
an encoding module, coupled to the memory interface, wherein the encoding module comprises:
a shared memory; and
a parity generation module, coupled to the shared memory, reading at least one basic vector from the shared memory, determining a dimension of the at least one basic vector, generating a generation matrix according to the at least one basic vector with the determined dimension, converting a raw data into a codeword through the generation matrix, and storing the codeword into the memory chip through the memory interface.

12. The memory controller according to claim 11, wherein the parity generation module comprises at least one parity generator, and the at least one parity generator is respectively coupled to the shared memory, wherein when a number of the at least one parity generator is greater than 1, the parity generators sequentially read the at least one basic vector from the shared memory.

13. The memory controller according to claim 11, wherein the parity generation module comprises at least one parity generator and an integrated output circuit, wherein each of the at least one parity generator comprises:

a control circuit, coupled to the shared memory, reading at least one first basic vector among the at least one basic vector from the shared memory, determining a dimension of the at least one first basic vector, and generating a submatrix column of the generation matrix according to the at least one first basic vector with the determined dimension;

an operational circuit, coupled to the control circuit, and converting the raw data into an encoded data through the submatrix column; and a register circuit, coupled to the operational circuit, and storing the encoded data or a partial encoded data generated by the operational circuit according to the raw data, wherein the integrated output circuit outputs the codeword according to the raw data and the at least one encoded data from the at least one parity generator.

14. The memory controller according to claim 13, wherein the control circuit comprises:

a shift control circuit, coupled to the shared memory, reading the at least one first basic vector from the shared memory, determining the dimension of the at least one first basic vector according to a control signal, and performing a shifting operation on the at least one first basic vector with the determined dimension to generate the submatrix column; and a matrix register circuit, coupled to the shift control circuit and the operational circuit, and storing the submatrix column.

15. The memory controller according to claim 14, wherein the shift control circuit comprises:

a basic vector register circuit, coupled to the shared memory and the matrix register circuit, and storing the at least one first basic vector from the shared memory; and a shift multiplexer, having a plurality of input terminals coupled to a plurality of output terminals of the basic vector register circuit, and having an output terminal coupled to an input terminal of the basic vector register circuit, wherein the shift multiplexer selectively reads a specific bit from the at least one first basic vector according to the control signal through one of the input terminals of the shift multiplexer to determine the dimension of the at least one first basic vector, and the shift multiplexer sends the at least one specific bit back to the basic vector register circuit through the output terminal of the shift multiplexer to perform the shifting operation on the at least one first basic vector with the determined dimension.

16. The memory controller according to claim 11, wherein the parity generation module calculates v=cG, wherein c represents the raw data, G represents the generation matrix, and v represents the codeword.

* * * * *